United States Patent
Chang

(10) Patent No.: US 6,210,188 B1
(45) Date of Patent: Apr. 3, 2001

(54) ELECTRICAL CARD CONNECTOR HAVING A CARD EJECTION MECHANISM

(75) Inventor: Jen-Jou Chang, Yung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/296,857

(22) Filed: Apr. 22, 1999

(30) Foreign Application Priority Data

Dec. 24, 1998 (TW) ................................................ 87221555

(51) Int. Cl.<sup>7</sup> ....................................................... H01R 13/62
(52) U.S. Cl. ............................................................. 439/159
(58) Field of Search ...................................... 439/157, 158, 439/159, 633

(56) References Cited

U.S. PATENT DOCUMENTS

| | | | | |
|---|---|---|---|---|
| 5,368,493 | * | 11/1994 | O'Brien et al. | 439/160 |
| 5,683,258 | * | 11/1997 | Takano et al. | 439/159 |
| 6,033,242 | * | 3/2000 | Oguchi et al. | 439/159 |
| 6,042,401 | * | 3/2000 | Oguchi et al. | 439/159 |
| 6,059,588 | * | 5/2000 | Tung et al. | 439/159 |

* cited by examiner

Primary Examiner—Khiem Nguyen
Assistant Examiner—Michael C. Zarroli
(74) Attorney, Agent, or Firm—Wei Te Chung

(57) ABSTRACT

An electrical card connector includes a main body (1) having a dielectric housing (11), a number of terminals (12) received in the housing, and a mounting casing (13) assembled to the housing, and a card ejection mechanism (2) mounted to the casing of the main body. The card ejection mechanism includes an operating rod (21), a connecting rod (22) having an end pivotally attached to an end of the operating rod, and a card ejecting lever (23) pivotally attached to an opposite end of the connecting rod. The connecting rod has a first fulcrum (1313), and the card ejecting lever has a second fulcrum (2312) which is movable a predetermined distance. When the operating rod acts on the connecting rod to pivot about the first fulcrum, the arm of the connecting rod pivots causing the card ejecting lever to move a distance in a rearward direction, thus the card is ejected a distance. When the second fulcrum of the card ejecting lever abuts against the casing, the card ejecting lever begins to pivot about the second fulcrum, thus the connecting rod and the card ejecting lever work together and eject the card a relatively long distance.

9 Claims, 6 Drawing Sheets

ELECTRICAL CARD CONNECTOR HAVING A CARD EJECTION MECHANISM

BACKGROUND OF THE INVENTION

1. Field of the Invention

The present invention relates to an electrical card connector, and particularly to an electrical card connector with a card ejection mechanism which requires a relatively small operation force.

2. Description of Prior Art

After an electrical card is inserted into an electrical card connector, ejection of the card therefrom can be difficult since the card is connected with a plurality of terminals and an available area of the card for a user to grip is relatively limited. Therefore, electrical connectors are now often equipped with card ejection mechanisms for mechanically ejecting electrical cards, which simplifies the ejection of the electrical cards. Such card ejection mechanisms are disclosed in U.S. Pat. Nos. 5,655,918 and 5,383,789, and Taiwan Patent Application Nos. 83211908, 84210016, and 8520853. Each card ejection mechanism mentioned above has a disadvantage that it cannot displace a card a sufficient distance beyond the connector. A card that is ejected by each mechanism mentioned above is difficult for a user to grasp thereby moving the card away from the connector.

SUMMARY OF THE INVENTION

Accordingly, an object of the present invention is to provide an electrical card connector having a card ejection mechanism providing a long displacement distance sufficient to completely eject a card from the connector.

In the preferred embodiment of the present invention, the electrical card connector comprises a main body having a dielectric housing, a plurality of terminals received in the housing, and a mounting casing assembled to the housing, and a card ejection mechanism mounted to the casing of the main body. The card ejection mechanism includes an operating rod, a connecting rod having an end pivotally attached to one end of the operating rod, and a card ejecting lever pivotally attached to another end of the connecting rod, wherein the connecting rod has a first fulcrum, and the card ejecting lever has a second fulcrum which is movable a predetermined distance.

When the operating rod acts on the connecting rod to pivot about the first fulcrum, the arm of the connecting rod is pivoted causing the card ejecting lever to move a distance in a rearward direction, thus the card is ejected a distance. When the second fulcrum of the card ejecting lever abuts against the casing, the card ejecting lever begins to pivot about the second fulcrum. Thus, the connecting rod and the card ejecting lever work together to eject the card a relatively long distance.

The card ejecting lever has two symmetrical, slightly oblique card ejecting arms. The second fulcrum is located where the two arms are linked. The connecting rod is a slightly bent planar board. The first fulcrum is located where the board is bent which is closer to the end pivotally attached to the card ejecting lever than to the end pivotally attached to the operating rod.

BRIEF DESCRIPTION OF THE DRAWINGS

Other objects and advantages of the present invention will be understood from the following description of an electrical card connector according to a preferred embodiment of the present invention shown in accompanying drawings, in which.

DETAILED DESCRIPTION OF THE PREFERRED EMBODIMENT

Figure 1:
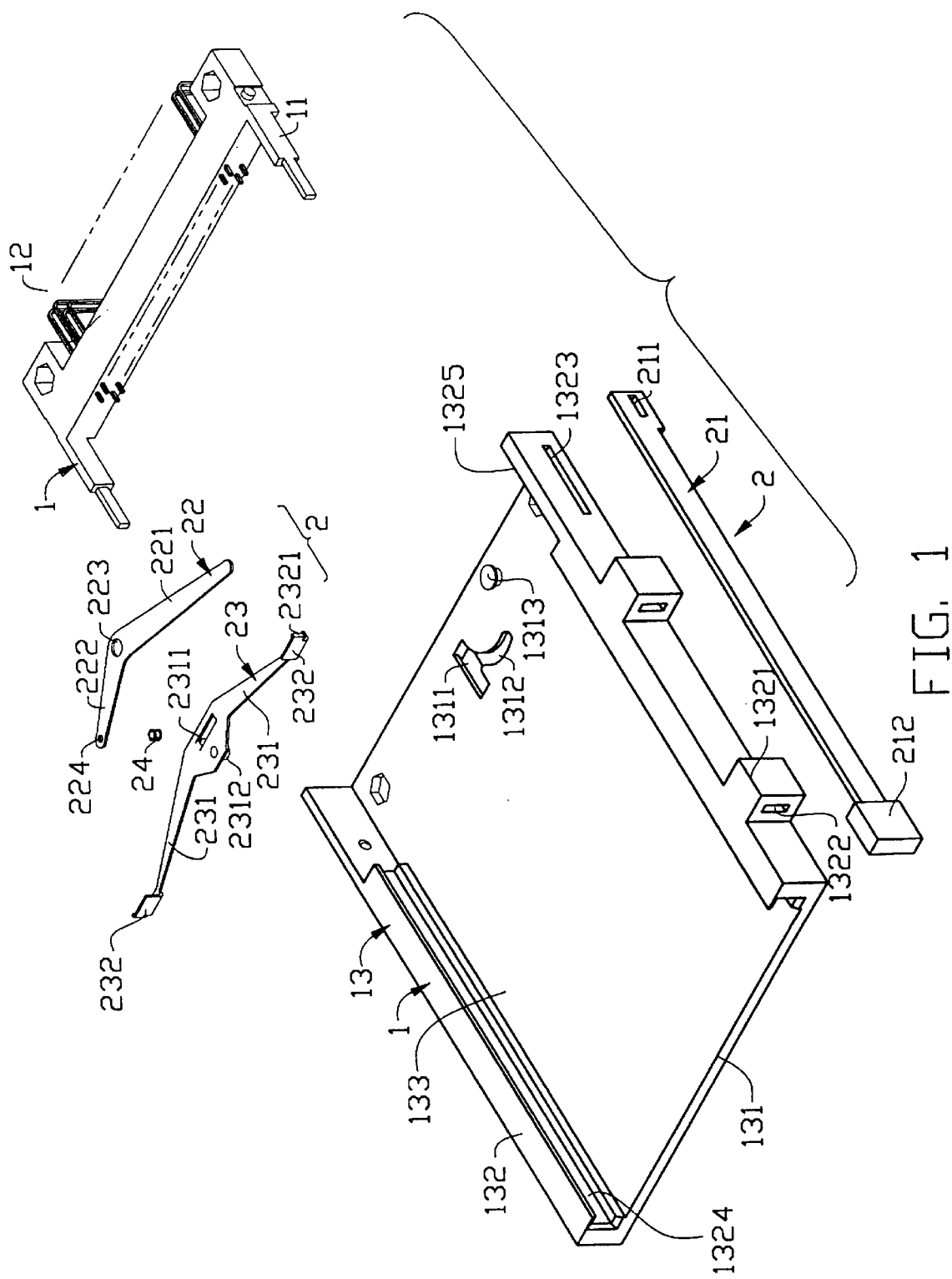
FIG. 1 is an exploded view of an electrical card connector embodying the concepts of the present invention.
Figure 2:
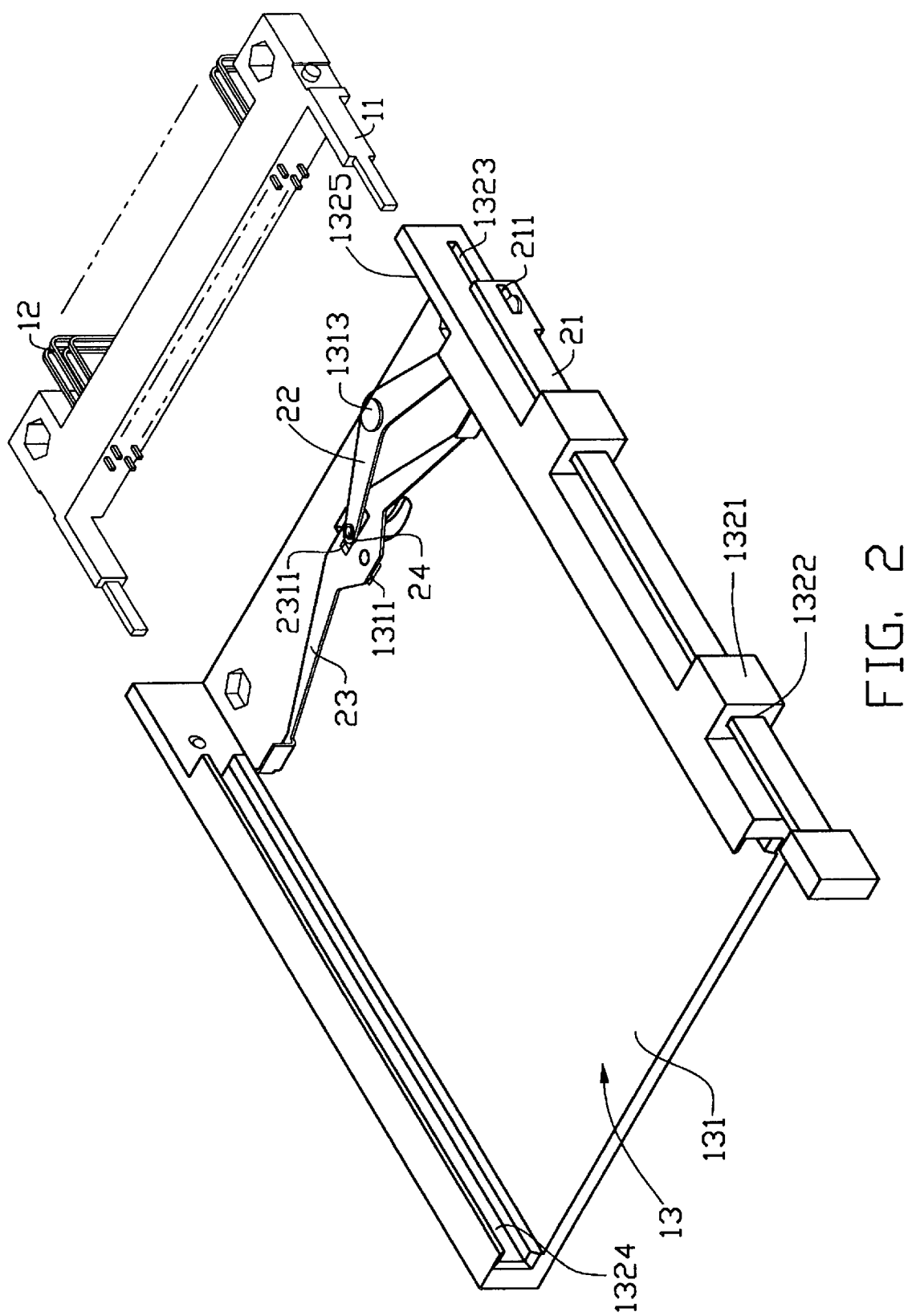
FIG. 2 is a partially assembled view of the electrical card connector of FIG. 1.
Figure 3:
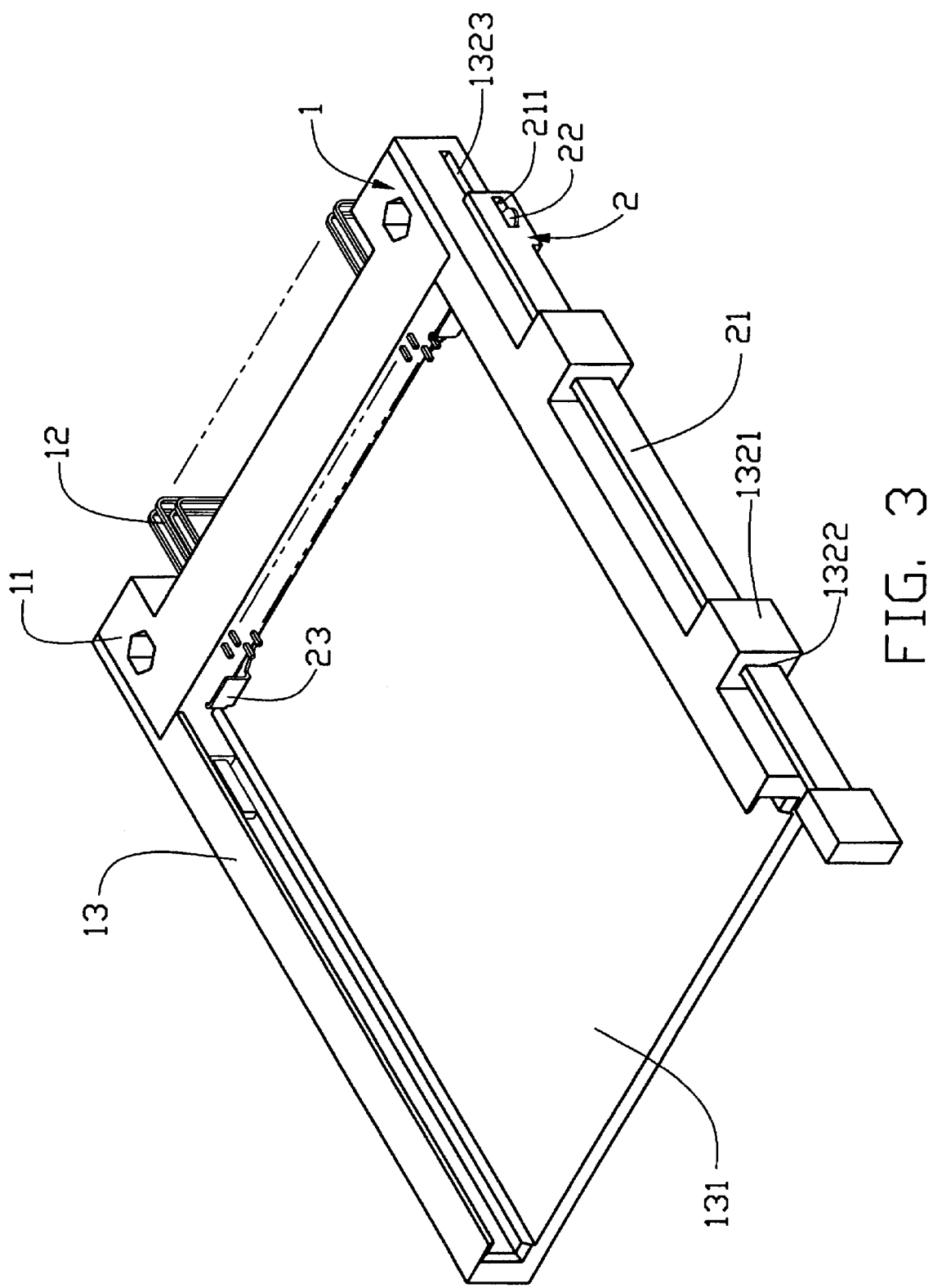
FIG. 3 is a fully assembled view of FIG. 1.
Figure 4:
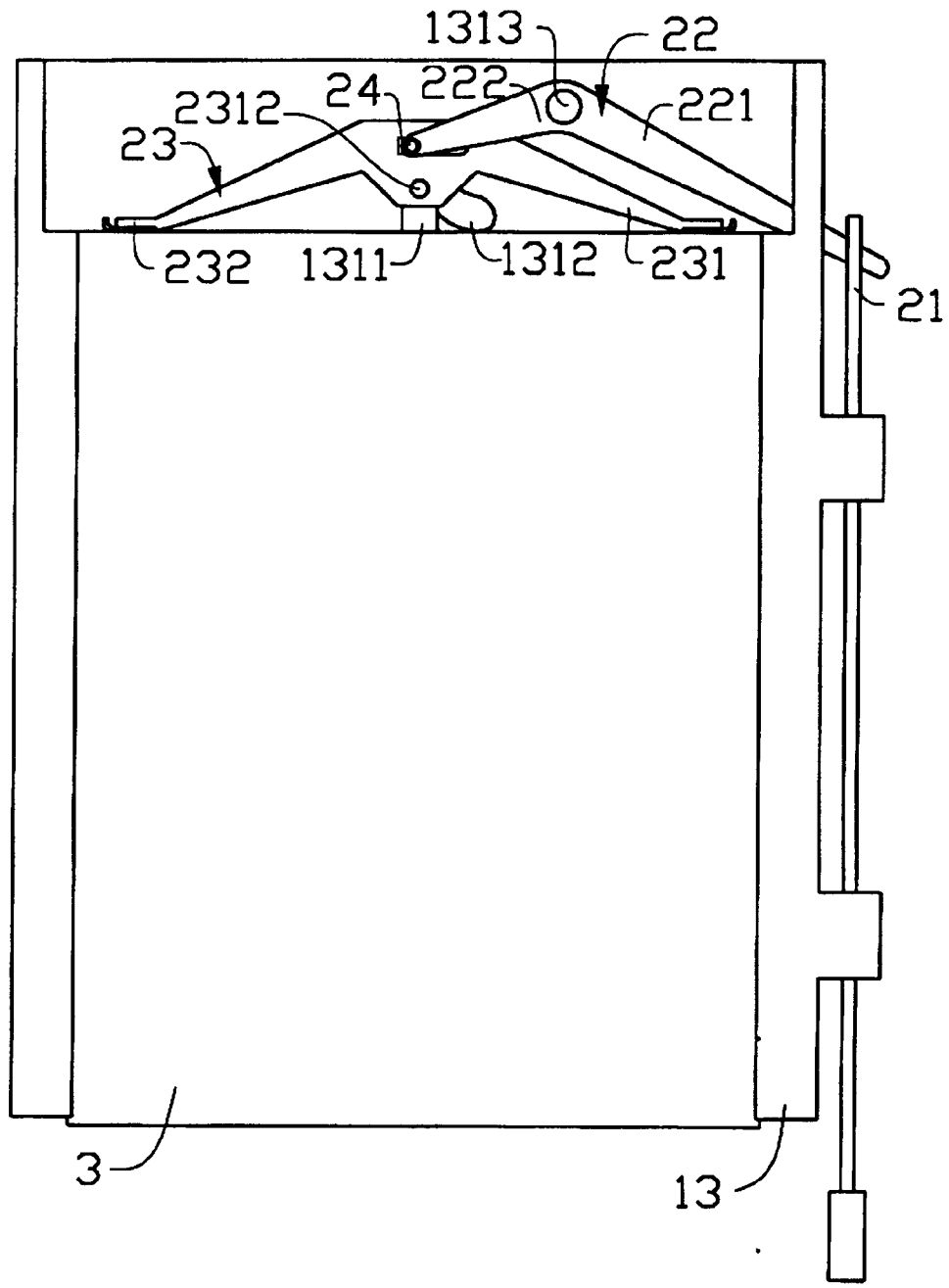
FIG. 4 is a plan view of the electrical card connector with a housing and terminals thereof being removed therefrom, and an electrical card being inserted therein.

Referring to FIG. 1–3, an electrical card connector comprises a main body 1 including a dielectric housing 11, a plurality of terminals 12 received in the housing 11, and a mounting casing 13 attached to the housing 11, and a card ejection mechanism 2 assembled to the main body 1. The casing 13 includes a plane board portion 131, and receiving portions 132 formed on opposite longitudinal sides on the same surface of the plane board portion 131. The plane board portion 131 forms a cavity 1311 in a center portion proximate an end thereof, an arced recess 1312 communicating with the cavity 1311, and a column 1313 upwardly projecting therefrom proximate a center of the arc of the recess 1312. The lengthwise direction of the cavity 1311 corresponds to the lengthwise direction of the receiving portions 132. Each receiving portion 132 defines a U-shaped channel 1324 in an inner face thereof. The channels 1324 face each other thereby defining a receiving space 133 for receiving an electrical card 3 (FIG. 4). The receiving portion 132 proximate the column 1313 forms two square projections 1321 along an outer face thereof. Each projection 1321 defines an opening 1322 therethrough. The openings 1322 are aligned with each other. A planar face 1325 is formed in an end of the inner face of the receiving portion 132 proximate the column 1313, and a groove 1323 is defined through the planar face 1325.

The card ejection mechanism 2 includes an operating rod 21, a connecting rod 22 having a first end attached to an end of the operating rod 21, and a card ejecting lever 23 attached to a second end of the connecting rod 22. The operating rod 21 defines a slot 211 in an end thereof, and forms a handle 212 at an opposite end for facilitating ejection of the card 3. The operating rod 21 is assembled to the casing 13 by extending the operating rod 21 through the openings 1322 of the casing 13 until the slot 211 of the operating rod 21 aligns with the groove 1323 of the casing 13.

The connecting rod 22 having a first arm 221 and a second arm 222 connected to the first arm 221, is substantially V-shaped. At the position where the two arms 221, 222 connect, a first hole 223 is defined for receiving the column 1313 of the casing 13. The column 1313 projecting beyond the connecting rod 22 is heated and riveted to the connecting rod 22 whereby the connecting rod 22 pivots about the column 1313. The second arm 222 defines a second hole 224 at the second end thereof. The distance between the center of the second hole 224 and the center of the first hole 223 is substantially equal to the radius of the arced recess 1312 of the casing 13. The first end of the connecting rod 22 is inserted into the slot 211 of the operating rod 21, whereby when the operating rod 21 is reciprocally moved, the connecting rod 22 pivots about the column 1313.

The card ejecting lever 23 includes two card ejecting arms 231 integrally formed in a V-shaped, planer structure. The card ejecting lever 23, forms two contact portions 232 at opposite ends thereof. Each contact portion 232 is formed as a rectangular plate extending from opposite ends of the V-shaped card ejecting lever 23. Each contact portion 232 has an arced end 2321 for maintaining contact with the electrical card when the card ejecting lever 23 pivots. An aperture 2311 is defined at a position where the two card ejecting arms 231 connect. A lengthwise direction of the aperture 2311 is parallel to a line connecting the two contact portions 232. A hinge 24 is used to connect the second connecting rod 22 with the card ejecting lever 23 by extending the hinge 24 through the hole 224 and the aperture 2311 and into the arced recess 1312. A trunnion 2312 located proximate the aperture 2311 is received in and is movable along the cavity 1311 of the casing 13.

In assembly, firstly the end of the operating rod 21 having the slot 211 is extended through the aperture 1322 of the projections 1321 of the casing 13. The first end of the connecting rod 22 extends through the groove 1323 of the casing 13 for reception in the slot 211 of the operating rod 21, and the column 1313 of the casing 13 extends through the first hole 223 of the connecting rod 22. The hinge 24 is received in the second hole 224 of the connecting rod 22 and the aperture 2311 of the card ejecting lever 23. The column 1313 projecting through the first hole 223 beyond a surface of the connecting rod 22 is heated and riveted whereby the connecting rod 22 is pivotally attached to the casing 13 and rotates about the column 1313. The housing 11 and the casing 13 are then assembled together by a known manner.

Figure 5:
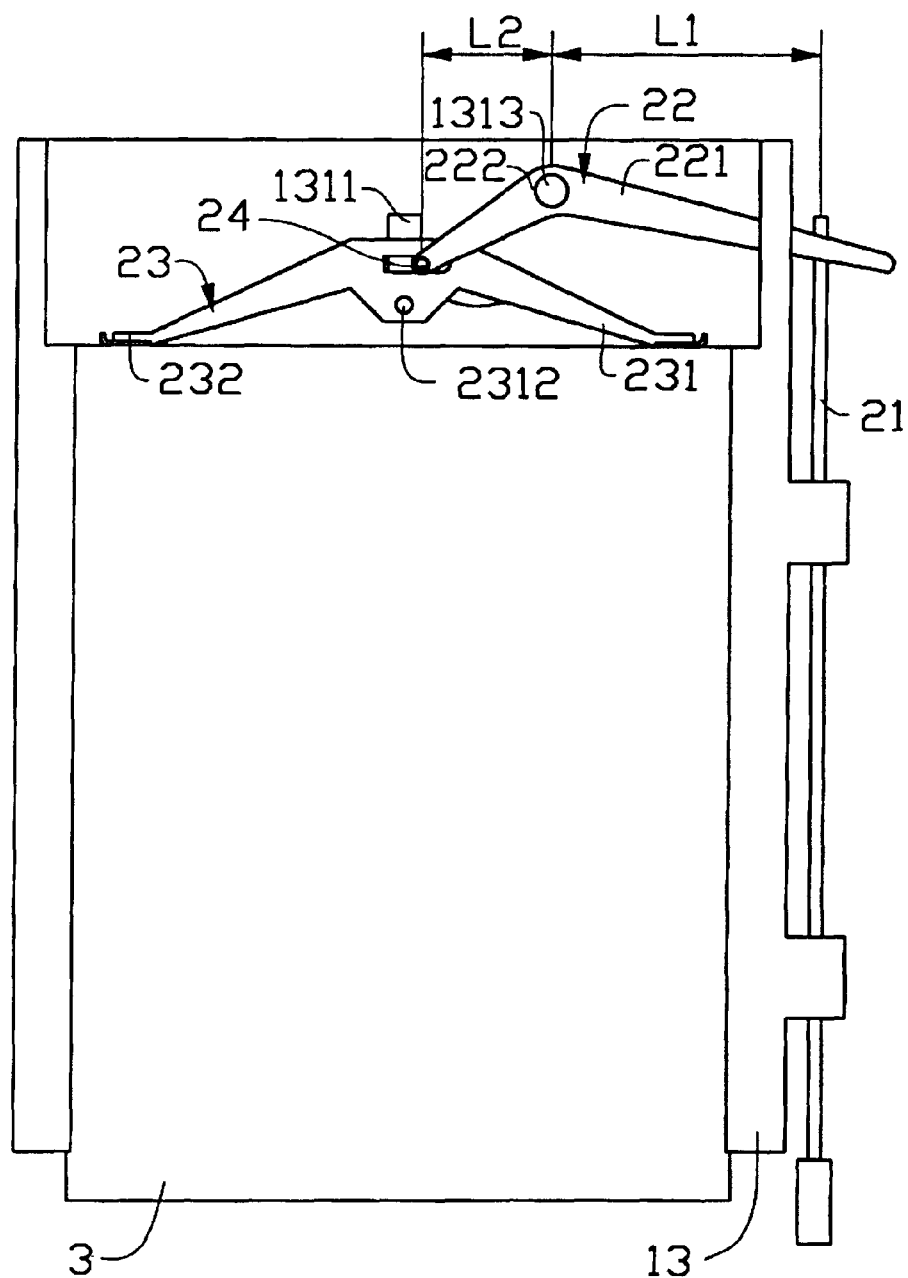
FIG. 5 is a view similar to FIG. 4, showing the position of the card ejection mechanism and the card after completion of a first stage of card ejection.
Figure 6:
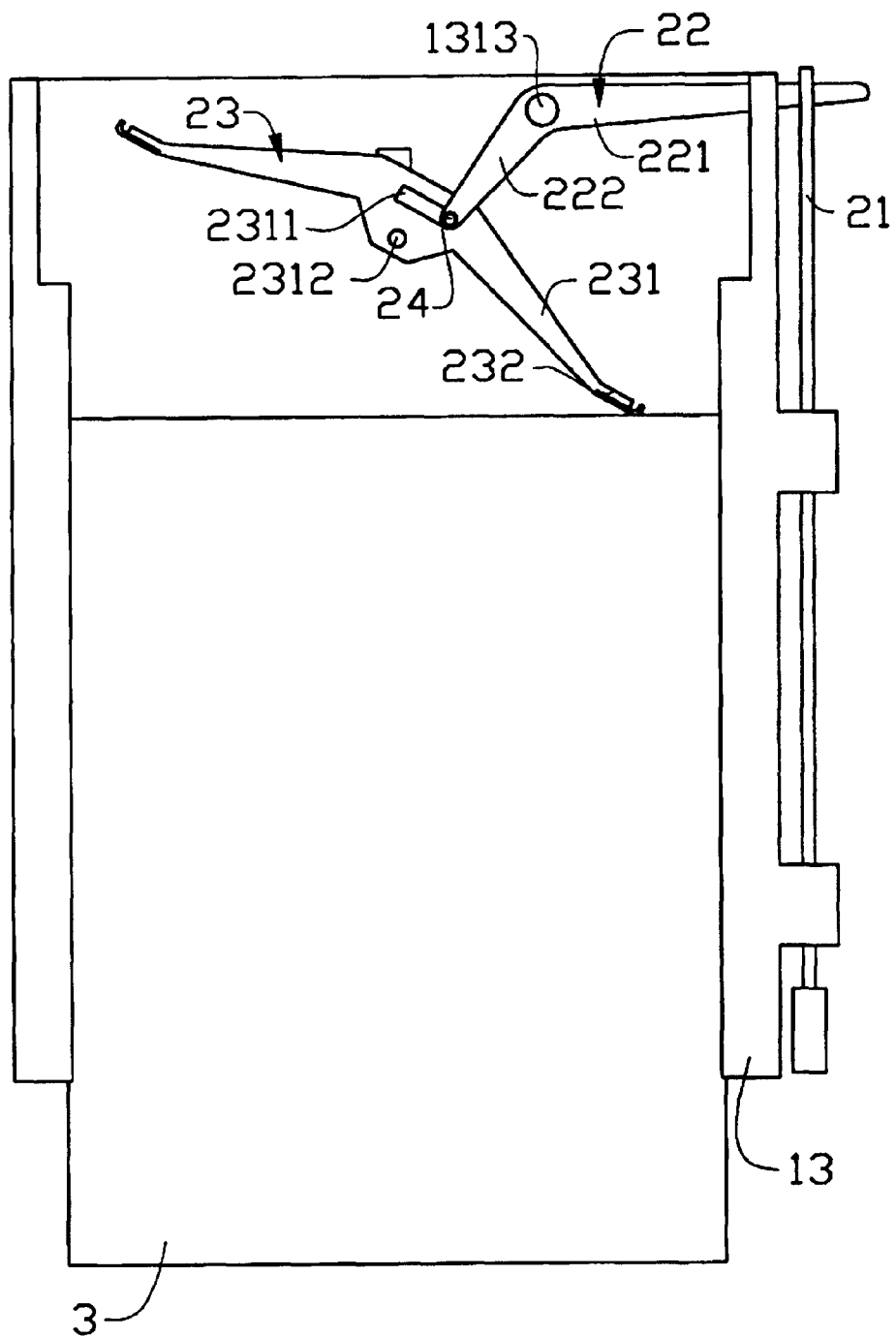
FIG. 6 is a view similar to FIG. 4, showing the position of the card ejection mechanism and the card after completion of a second stage of card ejection.

FIGS. 4, 5 and 6 show three operation stages of the card ejection mechanism 2 of the current invention. When the electrical card 3 is completely inserted thereinto, the contact portions 232 of the card ejecting lever 23 abut against the card 3, and a substantial portion of the operating rod 21 projects beyond the casing 13. Pushing the operating rod 21 toward the direction of insertion of the card 3 causes the card ejecting lever 23 to experience two stages of motion. The first stage involves a linear movement and the second stage involves a rotation movement.

In the first stage, the card ejecting lever 23 moves with the two contact portions 232 to push the card 3, which requires a relatively large card ejecting force. During the first stage, the operating rod 21 pushes the first arm 221 of the connecting rod 22, and the connecting rod 22 pivots about the column 1313 of the casing 13. Thus, the column 1313 functions as a fulcrum, and the card ejecting force acts on the second arm 222. FIG. 5 shows that a length L1 of the operating arm is larger than a length L2 of the ejecting arm, thus only a relatively small applied force is required during the first stage to generate the large card ejecting force.

During the first stage, the card ejecting lever 23 linearly moves toward the card 3 until the trunnion 2312 thereof abuts against an inner surface of the cavity 1311 of the casing 13. Then the second stage of the motion of the card ejection mechanism 2 begins. During the second stage, the hinge 24 moves along the arced recess 1312, the connecting rod 22 pivots about the column 1313, and the card ejecting lever 23 pivots about the trunnion 2312 clockwise as shown in FIG. 6 to have its right contact portion 232 to further eject the card 3 out of the casing 13. The pivoting motion of the card ejecting lever 23 provides a relatively long card ejection distance.

It is understood that the invention may be embodied in other specific forms without departing from the spirit of the central characteristics thereof. Thus, the present examples and embodiments are to be considered in all respects as illustrative and not restrictive, and the invention is not to be limited to the details given herein.

I claim:

1. An electrical card connector comprising:
   a main body having a dielectric housing, a plurality of terminals received in the housing, and a mounting casing assembled to the housing; and
   a card ejection mechanism mounted to the casing of the main body, the card ejection mechanism including an operating rod, a connecting rod pivotally mounted to the casing, and a card ejecting lever having two card ejecting arms, a second fulcrum being formed at a position where the two arms are linked, the card ejecting lever being guidingly movable in the casing by the connecting rod;
   wherein said casing of said main body defines a cavity, and said second fulcrum of the card ejecting lever is formed as a round trunnion for being received in the cavity, whereby when the trunnion abuts against an inner surface of the cavity, the card ejecting lever pivots about the trunnion, the connecting rod being pivotable by the operating rod to linearly move the card ejecting lever and a subsequent pivotable movement of the connecting rod moving the card ejecting lever to effectuate a turning movement of the card ejecting lever.

2. An electrical card connector comprising:
   a main body having a dielectric housing, a plurality of terminals received within the housing, and a mounting casing assembled to the housing; and
   a card ejection mechanism mounted to the casing of the main body, the card ejection mechanism including an operating rod, a connecting rod pivotally mounted to the casing, and a card ejecting lever guidingly movable in the casing by the connecting rod; wherein
   a hinge is attached to one of the connecting rod and the card ejecting lever and moves along an aperture defined in the other of the connecting rod and the card ejecting lever so as to have the card ejecting lever rotate about a trunnion thereof and when the operating rod is moved linearly, one of the connecting rod and the card ejecting lever rotates clockwise and the other rotates counterclockwise.

3. An electrical card connector comprising:
   a main body having a dielectric housing, a plurality of terminals received within the housing, and a mounting casing assembled to the housing;
   a card ejection mechanism mounted to the casing of the main body, the card ejection mechanism including an operating rod, a connecting rod pivotally mounted to the casing, and a card ejecting lever guidingly movable in the casing by the connecting rod; and
   means for guidingly rotating the card ejecting lever when the connecting rod is rotated, said means including a hinge attached to one of the connecting rod and the card ejecting lever, the hinge being movable along an aperture defined in the other of the connecting rod and the card ejecting lever so as to have the card ejecting lever rotate about a trunnion thereof.

4. An electrical card connector comprising:
   a main body having a dielectric housing, a plurality of terminals received in the housing, and a mounting casing assembled to the housing; and
   a card ejection mechanism mounted to the casing of the main body, the card ejection mechanism including an operating rod, a connecting rod pivotally mounted to the casing, and a card ejecting lever guidingly movable in the casing by the connecting rod;

wherein the connecting rod is pivotable by the operating rod to linearly move the card ejecting lever and a subsequent pivotable movement of the connecting rod moves the card ejecting lever to effectuate a turning movement of the card ejecting lever;

wherein the connecting rod is a slightly bent planar board, a first fulcrum being formed at a position where the board is bent and being closer to the end pivotally attached to the card ejecting lever than to the end pivotally attached to the operating rod.

5. The electrical card connector as described in claim 4, wherein said casing of said main body forms a column, and said connecting rod forms a first arm pivotally attached to the operating rod, a second arm linked with the first arm and pivotally attached to the card ejecting lever, and a first hole is located between the two arms for receiving the column.

6. The electrical card connector as described in claim 5, wherein said card ejecting lever defines an aperture in a middle portion thereof, said second arm of the connecting lever defines a second hole, and a hinge is provided to pivotally join the card ejecting lever and the connecting rod through the aperture and the second hole.

7. The electrical card connector as described in claim 6, wherein an end of said operating rod defines a slot for receiving an end of the first arm of the connecting rod therein.

8. The electrical card connector as described in claim 5, wherein said casing of said main body forms an arced recess communicating with the cavity and having a center of curvature substantially coincident with a central axis of said column.

9. An electrical card connector comprising:

a main body having a dielectric housing, a plurality of terminals received in the housing, and a mounting casing assembled to the housing; and a card ejection mechanism mounted to the casing of the main body, the card ejection mechanism including an operating rod, a connecting rod pivotably mounted to the casing, and a card ejecting lever guidingly movable in the casing by the connecting rod;

wherein the connecting rod is pivotable by the operating rod to move the card ejecting lever in two sequential ejecting motions, the first motion being a linear movement of the card ejecting lever, and the second motion following a further pivotal movement of the connecting rod and being a rotating movement of the card ejecting lever.

* * * * *